United States Patent
Lusky et al.

(10) Patent No.: US 7,408,493 B2
(45) Date of Patent: Aug. 5, 2008

(54) SYSTEMS AND METHODS FOR AUTOMATIC GAIN CONTROL

(75) Inventors: Itay Lusky, Hod Hasharon (IL); Ofir Shalvi, Herzlia (IL); Liran Brecher, Kfar-Saba (IL)

(73) Assignee: Texas Instruments Incorporated, Dallas, TX (US)

( * ) Notice: Subject to any disclaimer, the term of this patent is extended or adjusted under 35 U.S.C. 154(b) by 345 days.

(21) Appl. No.: 11/134,194

(22) Filed: May 20, 2005

(65) Prior Publication Data

US 2006/0261992 A1  Nov. 23, 2006

(51) Int. Cl.
*H03M 1/12* (2006.01)

(52) U.S. Cl. .................. 341/139; 341/155

(58) Field of Classification Search ......... 341/120–155; 330/279; 348/678; 375/345
See application file for complete search history.

(56) References Cited

U.S. PATENT DOCUMENTS

| | | | | |
|---|---|---|---|---|
| 4,859,964 A | * | 8/1989 | Jorgensen | 330/279 |
| 5,117,201 A | * | 5/1992 | Luther | 330/279 |
| 5,767,751 A | | 6/1998 | Magnusson | |
| 5,852,770 A | * | 12/1998 | Kasamatsu | 455/126 |
| 6,538,508 B2 | * | 3/2003 | Cheung et al. | 330/86 |
| 6,775,338 B1 | * | 8/2004 | Sutardja | 375/345 |
| 6,862,438 B2 | | 3/2005 | Darabi | |
| 6,888,405 B2 | * | 5/2005 | Cheung et al. | 330/86 |
| 6,958,648 B2 | * | 10/2005 | Cheung et al. | 330/86 |
| 6,985,543 B1 | * | 1/2006 | Sutardja | 375/345 |
| 2004/0212361 A1 | * | 10/2004 | Chong et al. | 324/210 |

\* cited by examiner

*Primary Examiner*—Lam T. Mai
(74) *Attorney, Agent, or Firm*—Steven A. Shaw; W. James Brady; Frederick J. Telecky, Jr.

(57) ABSTRACT

Systems and methods for automatic gain control are disclosed. In one aspect of the invention, a system is provided that comprises a programmable gain amplifier that amplifies an input signal based on a gain signal. The system further comprises an analog-to-digital converter that generates at least one digital output signal from the amplified input signal, and an automatic gain control component that determines an adjustment of the gain signal based on a comparison of the at least one digital output signal to a predetermined maximum amplitude reference level.

19 Claims, 3 Drawing Sheets

SYSTEMS AND METHODS FOR AUTOMATIC GAIN CONTROL

TECHNICAL FIELD

The present invention relates generally to electrical circuits, and more particularly to systems and methods for automatic gain control.

BACKGROUND

Automatic gain control loops are employed in a variety of applications to dynamically control the gain levels of an incoming signal. For example, receivers employ automatic gain control loops to adjust the gain of an incoming analog signal for maximizing the dynamic range of a subsequent analog-to-digital converter. In other words, the amplitude levels of the analog signal are adjusted to be as close to the conversion limits of the analog-to-digital converter, so to fully utilize the resolution of the analog-to-digital converter and hence reduce quantization noise. Automatic gain control loops can employ an automatic gain control component that compares an output signal of the analog-to-digital converter to a reference value that represents the square of the mean energy of the expected input signal in a worst case scenario. Error signals are generated based on the comparison over a plurality of output signal samples. The error signals are multiplied by a step size and accumulated to generate a gain word, which is a signal used to program a programmable or variable gain amplifier that controls the gain of the incoming signal.

Automatic gain control loops that employ a reference value that represents the square mean energy of a signal assume that the energy of the input signal is evenly distributed. However, if this assumption is not correct the operation of the automatic gain control loop will be severely affected. For example, a video signal conforming to National Television Standards Committee (NTSC) or Phase Alternate Line (PAL) has a synchronization portion and a data portion. The synchronization portion has a much stronger energy level than the data level. Furthermore, the data portion does not have evenly distributed energy. Therefore, an automatic gain control loop that employs a reference value that represents the square mean energy of a signal would be inappropriate for this type of signal. Another problem with an automatic gain control loop that employs a reference value that represents the square mean energy of a signal is that the reference value is calculated with respect to a worst case scenario, thus substantial headroom is incorporated into the calculation for a typical case. Therefore, the full dynamic range of the analog-to-digital converter is not employed. Yet another problem with this technique is that the convergence time of the loop is determined on a worst case scenario, which can be much longer than its actual convergence time.

SUMMARY

Systems and methods for automatic gain control of a gain control loop are provided. In accordance with an aspect of the present invention, a system is provided for automatic gain control. The system comprises a Programmable Gain Amplifier (PGA) or other analog components such as Variable Gain Amplifier (VGA) that amplifies an input signal based on a gain signal, and an analog-to-digital converter that generates at least one digital output signal from the amplified input signal. The system further comprises an automatic gain control component that determines an adjustment of the gain signal based on a comparison of the at least one digital output signal to a predetermined maximum amplitude reference level.

In another aspect of the present invention, a receiver is provided. The receiver comprises means for amplifying an analog input signal, means for converting the analog input signal into at least one digital output signal and means for adjusting the means for amplifying based on a comparison of at least one digital output signal to a maximum amplitude reference value.

In yet another aspect of the present invention, a method is provided for automatic gain control. The method comprises amplifying an analog input signal based on a programmed gain setting, converting the analog input signal to at least one digital output signal, and comparing the at least one digital output signal to a predetermined maximum amplitude reference level. The method further comprises adjusting the program gain setting based on the comparison.

In yet a further aspect of the invention, a method for automatic gain control is provided. The method comprises amplifying an analog input signal based on a programmed gain setting, converting the analog input signal to a plurality of digital output signals over a plurality of time windows, and determining at least one maximum value for each of the plurality of time windows. The method further comprises determining an average maximum value based on the at least one maximum value for each of the plurality of time windows, subtracting the average maximum value from a predetermined maximum amplitude reference level to generate an error signal and multiplying the error signal by a step size to provide a gain adjustment for the programmed gain setting.

DETAILED DESCRIPTION

Systems and methods for automatic gain control of a gain control loop are provided. The gain control loop includes an amplifier that receives an analog input signal that is amplified based on a gain setting of the amplifier. The amplified input signal is provided to an analog-to-digital converter (ADC) that converts the amplified input signal into one or more digital output signals. An automatic gain control component compares the one or more digital output signals to a predetermined maximum amplitude reference level to determine an amplifier gain setting by incrementing (up stepping by an up step size) or decrementing (down stepping by a down step size) an initial gain setting based on the comparison.

Figure 1:
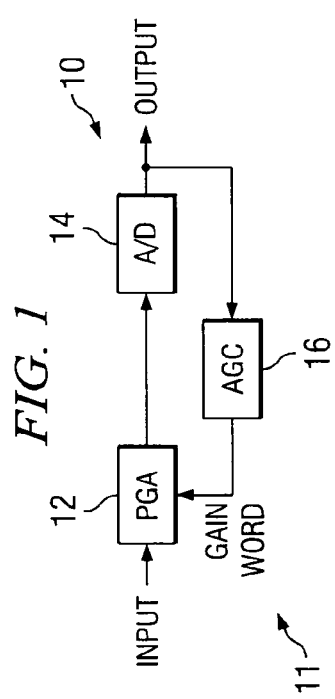
FIG. 1 illustrates a block diagram of a system for automatic gain control of a gain control loop in accordance with an aspect of the present invention.

FIG. 1 illustrates a system 10 for automatic gain control of a gain control loop 11 in accordance with an aspect of the present invention. The system 10 can be for example, a receiver or a portion of a receiver. The gain control loop 11 includes a programmable or variable gain amplifier 12 that receives an analog input signal that is amplified based on a gain setting of the amplifier 12. The amplifier gain setting can be set based on a gain control signal or word provided by an automatic gain control (AGC) component 16. The term component is used herein to define a functional element that can be comprised of hardware, software or a combination of hardware and software. The amplified input signal is provided to an analog-to-digital converter (ADC) 14 that converts the amplified input signal into one or more digital output signals based on a sample rate. The AGC component 16 compares the one or more digital output signals to a predetermined maximum amplitude reference level to determine an amplifier gain setting by incrementing (up stepping) or decrementing (down stepping) an initial gain setting based on the comparison. The comparing and determining process repeats causing the gain control loop 11 to converge. It is to be appreciated that the comparing can continue after convergence with minor changes to the gain word.

In one aspect of the invention, the predetermined maximum amplitude reference level is set at a saturation level or a percentage of a saturation level of the ADC 14 (e.g., maximal or minimal allowed ADC input voltage level). The gain setting is incremented if the output signal is less than the predetermined maximum amplitude reference level of the ADC 14, while the gain setting is decremented if the output signal is equal to or greater than the predetermined maximum amplitude reference level of the ADC 14. To verify loop stability, the incrementing or up step size and the decrementing or down step size are employed such that the ratio of down step size to up step size is greater than the number of possible output samples not at saturation to the number of possible output samples at saturation as described in the EQ. 1 below.

In another aspect of the invention, a maximum amplitude value is selected from a plurality of digital output samples of the ADC 14. The maximal amplitude will be defined based on a pre-defined block length of ADC 14 output samples. The maximum amplitude value can be averaged with a plurality of additional maximum amplitude values selected from respective plurality of digital output samples. An error value is determined by comparing the maximum amplitude value or an average maximum amplitude value to the predetermined maximum amplitude reference level. The error value is multiplied by a step size value, accumulated and added to an initial gain value to generate an adjusted gain signal. As previously described, this mechanism can be constantly active and will converge to the state where average of peak values is equal to the reference value.

Figure 2:
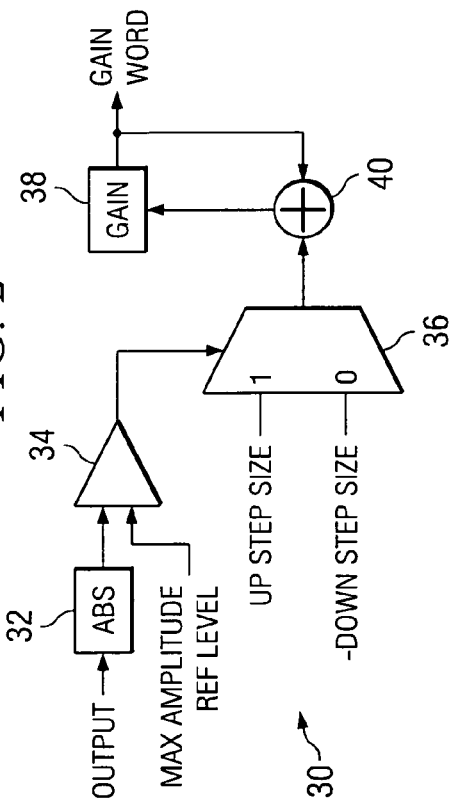
FIG. 2 illustrates a schematic block diagram of an automatic gain control (AGC) component in accordance with an aspect of the present invention.

FIG. 2 illustrates an AGC component 30 in accordance with an aspect of the present invention. The AGC component 30 includes an absolute component 32 that determines an absolute value of an output signal received from an ADC. The absolute value of the output signal is compared to a predetermined maximum amplitude reference level via a comparator 34. The predetermined maximum amplitude reference level can be set to or slightly below a saturation level or peak level of the ADC. The output state of the comparator 34 determines which input of a multiplexer 36 is selected. A first input of the multiplexer 36 includes an up step size value, while a second input of the multiplexer 36 includes a negative down step size value. The selected input is provided to a summer 40 which is added to a previous gain word setting and provided to a gain component 38, which sets the next or subsequent gain word. If the sampled output signal is below the maximum amplitude reference value, the comparator 34 selects the up step size value to be added to the previous gain word setting based on the following equation:

$$\text{gain}[i] = \text{gain}[i-1] + \text{UP\_STEP\_SIZE} \qquad \text{EQ: 1}$$

where i is an integer representing the discrete time index. If the sampled output signal is at or above the maximum amplitude reference value, the comparator 36 selects the negative down step size value to be added to the previous gain word setting based on the following equation:

$$\text{gain}[i] = \text{gain}[i-1] - \text{DOWN\_STEP\_SIZE} \qquad \text{EQ: 2}$$

Therefore, if the input signal to the amplifier is too attenuated, saturation will not occur and the input signal will be amplified more each input sample. The gain control loop monotonically advances to its correct working point each sample so the convergence time is dramatically reduced compared to common AGC algorithms based on energy estimation. The convergence time is the time the gain control loop takes to reach a steady state condition. This does not happen when employing a conventional AGC because the conventional AGC advances towards the appropriate working point only in the mean sense, whereas the AGC of the present example approaches the appropriate working point monotonically. Furthermore, if the input signal is too strong, saturation will take place and the signal will be attenuated. When the input signal is at nominal energy, the signal will be amplified or attenuated incrementally each time and the output signal remains around the maximum pre-defined dynamic range available for the gain control loop. This input signal will be further amplified, until the dynamic range of the gain control loop is substantially utilized.

It is to be appreciated that it is desirable to operate the ADC out of saturation since data can be lost by the clipping of the input signal. Therefore, in another aspect of the invention, the maximum reference value is selected to be P* saturation value of the ADC, where P is a percentage value less than 100. For example, P can be selected to be 90% or 0.9 of the saturation value, for example, a value of about six in the above example.

One aspect of the AGC component 30 is to define the ratio between down step size to up step size. A general rule for facilitating stabilization of the gain control loop is based on the following equation:

$$\frac{|\text{down\_step\_size}|}{|\text{up\_step\_size}|} > \frac{\text{number of possible output samples not at maximum level}}{\text{number of possible output samples at maximum level}} \qquad \text{EQ. 3}$$

For example, if the transmitted signal has a uniformly-distributed alphabet of −7, −5, −3, −1, 1, 3, 5, 7, then the probability of the symbol not at maximum level (−5, −3, −1, 1, 3, 5) is 3-times the probability of symbols at maximum level (−7, 7). Therefore, to verify loop stability we need to set the ratio between down step size to up step size to be greater than six divided by two, which is three.

It is to be appreciated that if the ratio between down step size and up step size is too large, damage to the rest of the receiver blocks can occur due to abrupt gain change. Therefore, in one aspect of the invention, the down step size is dynamically modified to be down step size divided by X for the next X consecutive samples, where X is an integer. This provides the same total gain change but over a longer period of time.

Figure 3:
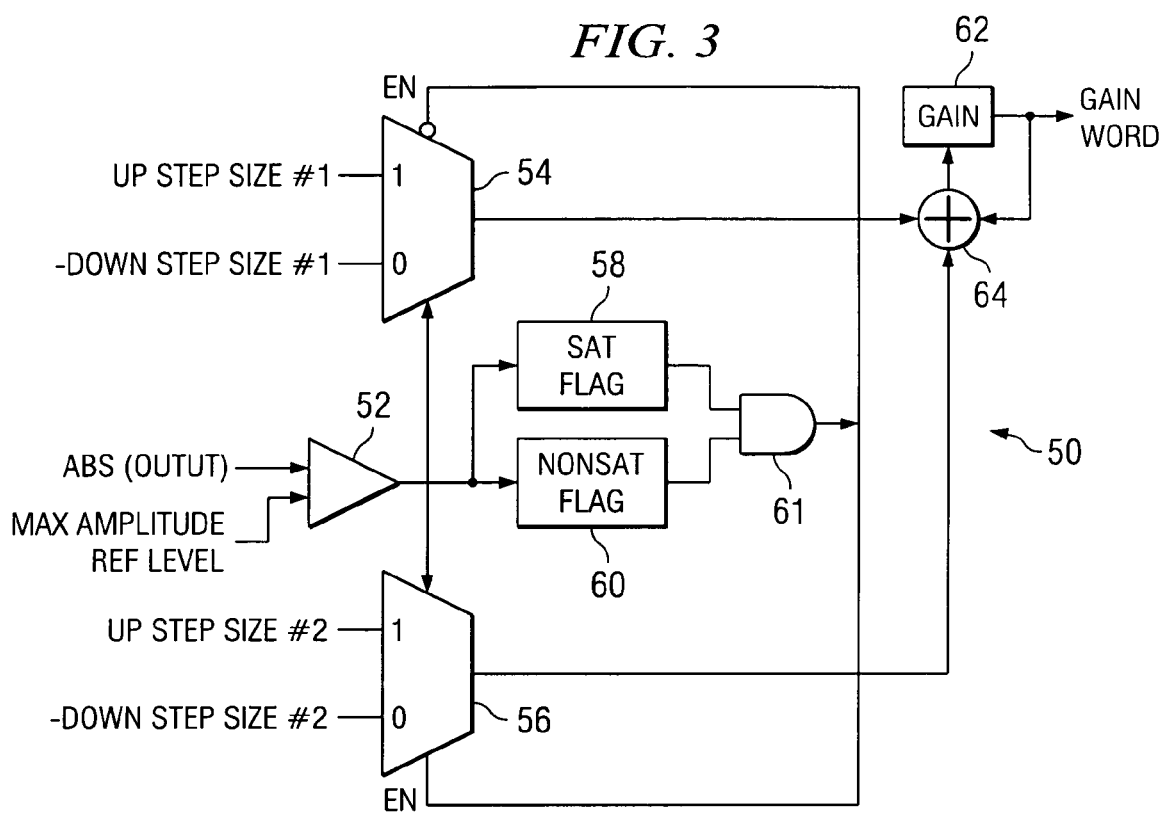
FIG. 3 illustrates a schematic block diagram of an AGC component employing flags to facilitate loop convergence in accordance with an aspect of the present invention.

FIG. 3 illustrates an AGC component 50 employing flags to facilitate loop convergence in accordance with another aspect of the present invention. The AGC component 50 employs a first multiplexer 54 that provides a first up step size #1 and a first down step size #1 and a second multiplexer 56 that provides a second up step size #2 and a second down step size #2, wherein the second up step size is smaller than the first up step size and the second down step size is smaller than the first down step size. The AGC component 50 also includes a saturation flag 58 that is set at a first time that the absolute of an output signal is at or above a predetermined maximum amplitude reference level (e.g., saturation) and a nonsaturation flag 60 that is set the first time a sample is received that is below the predetermined maximum amplitude reference level (e.g., not at saturation). The nonsaturation flag 58 and the saturation flag 60 provide a mechanism to determine when a gain control loop is beginning to converge. Therefore, when both flags 58 and 60 are set, the gain control loop is near its working point. Therefore, the AGC component 50 can move from employing the larger first up and down step size increments resulting in a faster convergence rate but high gain jitter to the smaller second up and down step size increments resulting in a slower convergence rate but lower steady-state gain jitter.

The AGC component 50 includes a comparator 52 that compares an absolute value of a sampled output signal of the ADC to a predetermined maximum amplitude reference level. The predetermined maximum amplitude reference level can be set to or below a saturation level or peak level of the ADC. The output state of the comparator 52 determines which input of one of the first multiplexer 54 or the second multiplexer 56 is selected. For example, the comparator 52 can output a logic high when an absolute value of the sampled output signal is at or greater than the predetermined maximum amplitude reference level (e.g., has achieved saturation). The comparator 52 can output a logic low when an absolute value of the sampled output signal is below the predetermined maximum amplitude reference level (e.g., not in saturation). The saturation flag 58 and nonsaturation flag 60 are also coupled to the output of the comparator 52. The output of the saturation flag 58 and the nonsaturation flag 60 are coupled to a Logical AND gate or operation 61. The output of the Logical AND gate or operation 61 selects the first multiplexer 54 and the first larger step sizes in a reset or logical low condition, and selects the second multiplexer 56 and the second smaller step sizes in a set or logical high condition.

At initialization, the Logical AND gate or operation 61 is in a reset condition enabling the first multiplexer 54, which provides the larger up step size and the larger down step size. The saturation flag 58 is set once it is determined that an output sample has an amplitude that is at or greater than the predetermined maximum amplitude reference level (e.g., has achieved saturation), thus providing a logic high on the output of the comparator 52. The nonsaturation flag 60 is set once it is determined that an output sample has an amplitude that is below the predetermined maximum amplitude reference level (e.g., not in saturation), thus providing a logic low on the output of the comparator 52. The order in which the saturation flag 58 and the nonsaturation flag 60 are set is based on the magnitude of the initial input signal relative to the maximum amplitude reference level. The setting of both the saturation flag and the nonsaturation flag cause the Logical AND operation or gate 61 to be in a logical high state and select the second multiplexer 56 and the smaller up step size and the smaller down step size. At this point, the AGC 50 has reached the working point of the gain control loop and smaller step sizes can be employed.

The output of the first multiplexer 54 and the second multiplexer 56 are provided to a summer 64 which is added to a previous gain word setting and provided to a gain component 62, which sets the next gain word. The up step size of the selected multiplexer 54 or 56 is provided to the summer 64 when the sampled output is below the predetermined maximum amplitude reference level, and the down step size of the selected multiplexer 54 or 56 is provided to the summer 64 when the sampled output is at or above the predetermined maximum amplitude reference level.

Figure 4:
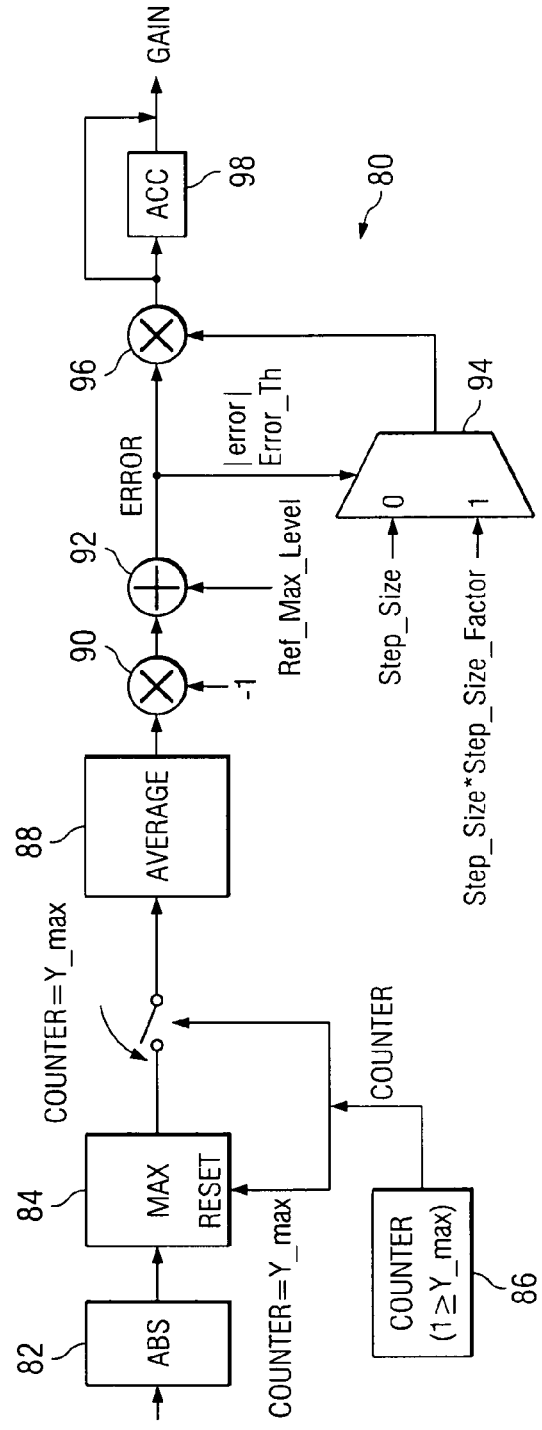
FIG. 4 illustrates a schematic block diagram of another AGC component in accordance with an aspect of the present invention.

FIG. 4 illustrates an AGC component 80 in accordance with another aspect of the present invention. The AGC component 80 selects a time window that is opened every YMax samples, where YMax is an integer greater than or equal to two. The time window should be selected to cover a portion of the signal that provides a good measure of the input signal peak. For example, in a NTSC/PAL signal each line includes a synchronization signal and a data portion that is transmitted during a 63.5 microsecond window. The synchronization signal has substantially greater power distribution than the data portion. The time window should be large enough to cover both the synchronization signal and the data portion, so that the maximal value will be estimation of the power of 100% modulation of the NTSC/PAL signal. Assuming sample rate of 25 Msamples/sec for example, YMax should be selected to be larger than 63.5*25=1587 samples.

The AGC component 80 includes an absolute component 82 that determines an absolute value of an output signal received from an ADC. A maximum component 84 selects a maximum value from YMax samples, and a counter 86 resets the maximum component 84 every YMax samples. An averager 88 determines an average maximum value over a plurality of sequential time windows. This provides a good estimation of the input signal's maximum amplitude. A negative value of the average maximum value is determined by multiplying the average maximum value by negative one via a multiplier 90. The negative average maximum value is added to a predetermined maximum amplitude reference level (Ref_Max_Level) via a summer 92 to generate an error signal. The predetermined maximum amplitude reference level specifies the part of the dynamic range of the ADC to be employed. It is to be appreciated that not all the dynamic range of the ADC should be used so that samples affected from strong additive noise will not be saturated. The error signal is multiplied with a given step size via a multiplier 96 and accumulated in an accumulator 98. The output of the accumulator 98 is the gain signal which can be added to a previous gain signal or gain word to control a programmable gain amplifier.

A positive gain signal means Ref_Max_Level>maximum signal energy so the gain of the amplifier would be increased. A negative gain signal means Ref_Max_Level<maximum signal energy so the gain of the amplifier would be decreased and the signal attenuated. The AGC component 80 also includes a multiplexer 94 for selecting between a step size and a step size multiplied by a step size factor. The step size factor provides an increased step size in the event that the absolute error is greater than an error threshold (|error|>Error_Th) to compensate for sudden changes in the signal's energy. Therefore, the user can control the tradeoff between convergence speed and ability to react to sudden gain change versus steady-state jitter.

In another aspect of the invention, the maximum value from the maximum component 84 can be determined by averaging X maximum samples from the plurality of YMax values, where X is an integer less than YMax. In this manner, a single noisy maximum input sample will have less effect on determining a gain signal.

Figure 5:
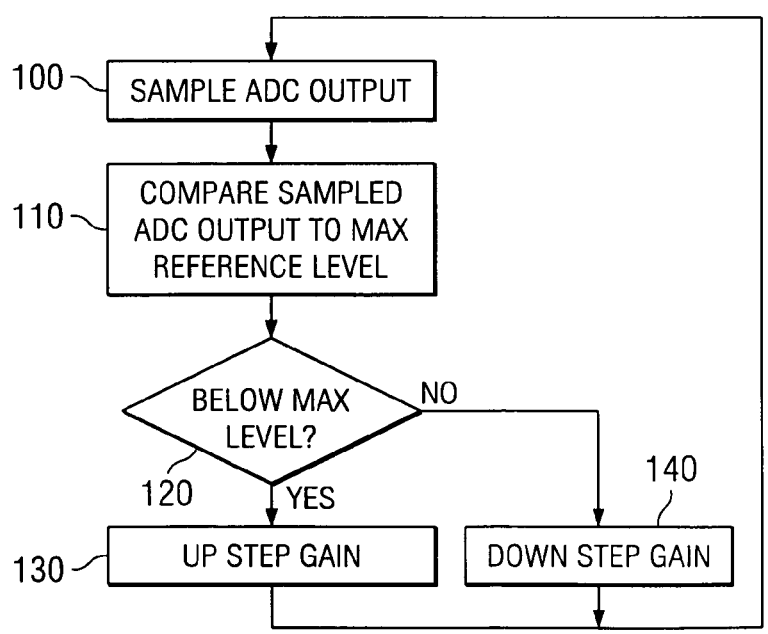
FIG. 5 illustrates a methodology for automatic gain control in accordance with an aspect of the present invention.
Figure 6:
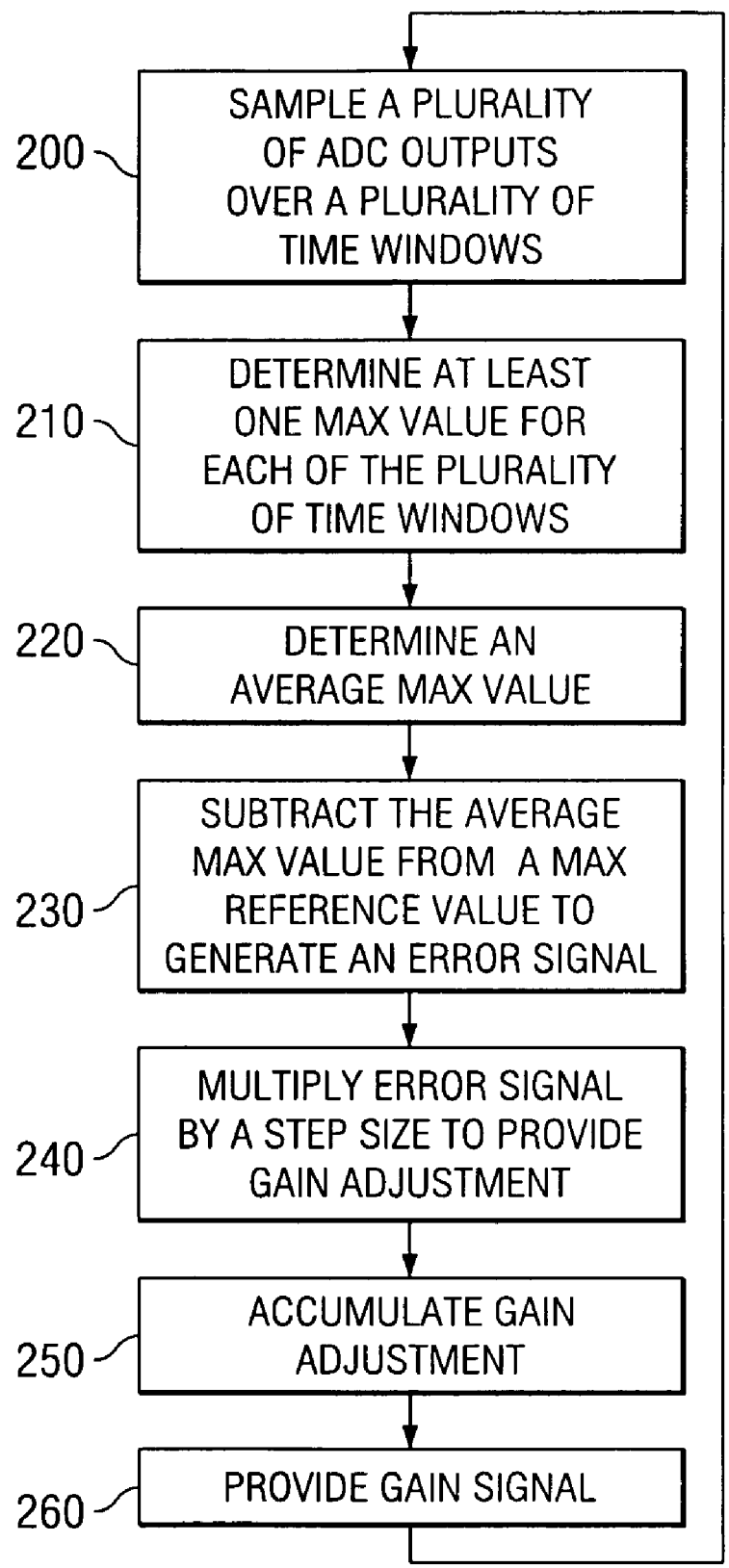
FIG. 6 illustrates another methodology for automatic gain control in accordance with an aspect of the present invention.

In view of the foregoing structural and functional features described above, methodologies in accordance with various aspects of the present invention will be better appreciated with reference to FIGS. 5–6. While, for purposes of simplicity of explanation, the methodologies of FIGS. 5–6 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 5 illustrates a methodology for automatic gain control in accordance with an aspect of the present invention. The methodology begins at 100 where an ADC of a gain control loop is sampled. At 110, the sampled ADC output is compared to a predetermined maximum amplitude reference level. The predetermined maximum amplitude reference level can be set to be at a saturation level of the ADC or at a percentage (e.g., 90%) of the saturation level of the ADC. The methodology then proceeds to 120. At 120, it is determined if the sampled ADC output is below the predetermined maximum amplitude reference level. If the ADC output is below the maximum reference level (YES), the previous gain is incremented by applying an up step size gain to the previous gain level based on EQ. 1 above. The methodology then returns to 100 to sample another ADC output. If the ADC output is not below the maximum reference level (NO), the previous gain is decremented by applying a down step size gain to the previous gain level based on EQ. 2 above. The methodology then returns to 100 to sample another ADC output.

The up step size value and the down step size value can be selected based on evaluating EQ. 3 above. Additionally, the up step size value and the down step size value can be reduced after it has been determined that a sampled output has exceeded the predetermined maximum amplitude reference level and other sampled output that does not exceed the predetermined maximum amplitude reference level, as illustrated in FIG. 2. Furthermore, the down step size value can be reduced by dividing the down step size by X and maintaining this reduced value for the next X consecutive samples. This achieves the same total gain change, but over a longer period in time.

FIG. 6 illustrates yet another methodology for automatic gain control in accordance with an aspect of the present invention. The methodology begins at 200 where a plurality of ADC outputs are sampled over a plurality of time windows. At 210, at least one maximum value is determined for each of the plurality of time windows. It is to be appreciated that a plurality of maximum values can be selected from given time window and averaged. At 220, an average maximum value is determined based on a maximum value for a plurality of time windows or an average of X maximal values from each of the plurality of time windows. At 230, the average maximum value is subtracted from a predetermined maximum amplitude reference level to generate an error signal. At 240, the error signal is multiplied by a step size to provide a gain adjustment value. The step size can be multiplied by a step size factor to increase the step size in the event that the absolute error is greater than an error threshold (|error|>Error_Th) to compensate for sudden changes in the signal's energy. At 250, the gain adjustment value is accumulated with one or more additional gain adjustments. At 260, a gain signal is provided that can be employed to modify a previous gain setting of a programmable gain amplifier.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for automatic gain control, the system comprising:
   a programmable gain amplifier that amplifies an input signal based on a gain signal;
   an analog-to-digital converter that generates at least one digital output signal from the amplified input signal; and
   an automatic gain control component that determines an adjustment of the gain signal by selecting between an up step size and a down step size based on a comparison of the at least one digital output signal to a predetermined maximum amplitude reference level, the down step size value being reduced for a predetermined number of consecutive output samples by dividing the down size step value by a fixed integer corresponding to the predetermined number of output samples.

2. The system of claim 1, further comprising a saturation flag that is set when a digital output signal is at or above the predetermined maximum amplitude reference level, and a nonsaturation flag that is set when a digital output signal is below the predetermined maximum amplitude reference level, wherein a first up step size and a first down step size is employed for adjustment of the gain signal before both flags are set and a second up step size and a second down step size is employed for adjustment of the gain signal upon both flags being set, the second up step size being smaller than the first up step size and the second down step size being smaller than the first down step size.

3. The system of claim 1, wherein the ratio between down step size to up step size is greater than a probability of a number of possible output samples below the maximum amplitude reference value divided by a probability of a number of possible output samples at or above the maximum amplitude reference value.

4. The system of claim 1, wherein the gain signal is a gain word transmitted from the automatic gain control component to the programmable gain amplifier to program the gain of the programmable gain amplifier.

5. The system of claim 1, wherein the automatic gain control component selects a maximum value of a time window that includes a predetermined number of digital output samples, and compares the maximum value to the maximum amplitude reference signal to generate an error signal based on the comparison, the error signal being multiplied by a step size to provide a gain adjustment value.

6. The system of claim 1, wherein the automatic gain control component averages a maximum value from a plurality of time windows, each including a predetermined number of digital output samples, to determine an average maximum value over the plurality of time windows, the automatic gain control component comparing the average maximum value to the maximum amplitude reference signal to generate an error signal based on the comparison, the error signal being multiplied by a step size to provide a gain adjustment value.

7. The system of claim 6, wherein the maximum value is an average of a plurality of maximum values from a given time window.

8. The system of claim 6, wherein the step size is multiplied by a step size factor if the error signal is greater than a predetermined error threshold.

9. A receiver comprising:
   means for amplifying an analog input signal;
   means for converting the analog input signal into at least one digital output signal, the at least one digital output signal being a maximum value of a plurality of digital output signals within a time window; and
   means for adjusting the means for amplifying based on a comparison of at least one digital output signal to a predetermined maximum amplitude reference level, the comparison generating an error signal that is multiplied by a step size to provide a gain adjustment to a programmed gain of the means for amplifying.

10. The receiver of claim 9, wherein the means for adjusting increments a programmed gain of the means for amplifying by an up step size if the at least one digital output signal is below the predetermined maximum amplitude reference level, and decrements the programmed gain of the means for amplifying by a down step size if the at least one digital output signal is at or above the predetermined maximum amplitude reference level.

11. The receiver of claim 9, wherein the at least one digital output signal comprises a plurality of digital output signal within a time window, the means for adjusting averaging a plurality of maximum values from the plurality of digital output signals to determine an average maximum value associated with the time window, the average maximum value being subtracted from the predetermined maximum amplitude reference level to generate an error signal that is multiplied by a step size to provide a gain adjustment to a programmed gain of the means for amplifying.

12. The receiver of claim 9, wherein the means for adjusting the means for amplifying averages a maximum value from a plurality of time windows, each including a predetermined number of digital output samples, to determine an average maximum value over the plurality of time windows, the means for adjusting comparing the average maximum value to the maximum amplitude reference signal to generate an error signal, the error signal being multiplied by a step size to provide a gain adjustment to a programmed gain of the means for amplifying.

13. A method for automatic gain control, the method comprising:
   amplifying an analog input signal based on a programmed gain setting;
   converting the analog input signal to at least one digital output signal;
   comparing the at least one digital output signal to a predetermined maximum amplitude reference level;
   up-stepping the program gain setting by an up step size if the at least one digital output signal is below the predetermined maximum amplitude reference level; and
   down-stepping the program gain setting by a down step size if the at least one digital output signal is at or above the predetermined maximum amplitude reference level.

14. The method of claim 13, wherein a first up step size and a first down step size is employed for adjustment of the program gain at initialization and a second up step size and a second down step size is employed for adjustment of the programmed gain after both a first time a digital output signal is at or above the predetermined maximum amplitude reference level and a digital output signal is below the predetermined maximum amplitude reference level, the second up step size being smaller than the first up step size and the second down step size being smaller than the first down step size.

15. The method of claim 13, wherein the down step size value is reduced for a predetermined number of output samples by dividing the down size step value by a fixed integer and the reduced down step size is employed for the following fixed integer predetermined number of output samples.

16. The method of claim 13, wherein the ratio between down step size to up step size is greater than a probability of a number of possible output samples below the maximum amplitude reference value divided by a probability of a number of possible output samples at or above the maximum amplitude reference value.

17. A method for automatic gain control, the method comprising:
   amplifying an analog input signal based on a programmed gain setting;
   converting the analog input signal to a plurality of digital output signals over a plurality of time windows;
   determining at least one maximum value for each of the plurality of time windows;
   determining an average maximum value based on the at least one maximum value for each of the plurality of time windows;
   subtracting the average maximum value from a predetermined maximum amplitude reference level to generate an error signal; and
   multiplying the error signal by a step size to provide a gain adjustment for the programmed gain setting.

18. The method of claim 17, further comprising multiplying the step size by a step size factor if the error signal is greater than a predetermined error threshold.

19. The method of claim 17, wherein the determining an average maximum value based on the at least one maximum value comprises averaging a plurality of maximum values for each of a given time window for the plurality of time windows, and averaging the average maximum values for each given window over a plurality of time windows.

* * * * *